United States Patent
Nakahara

(10) Patent No.: US 8,289,669 B2
(45) Date of Patent: Oct. 16, 2012

(54) SEMICONDUCTOR DEVICE INCLUDING OVER VOLTAGE PROTECTION CIRCUIT HAVING GATE DISCHARGE CIRCUIT OPERATED BASED ON TEMPERATURE AND VOLTAGE AS TO OUTPUT TRANSISTOR

(75) Inventor: Akihiro Nakahara, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 291 days.

(21) Appl. No.: 12/591,542

(22) Filed: Nov. 23, 2009

(65) Prior Publication Data

US 2010/0134941 A1    Jun. 3, 2010

(30) Foreign Application Priority Data

Nov. 28, 2008 (JP) ................................ 2008-304161

(51) Int. Cl.
*H02H 9/04* (2006.01)
(52) U.S. Cl. ........................................................ 361/91.1
(58) Field of Classification Search .................. 361/91.1
See application file for complete search history.

(56) References Cited

U.S. PATENT DOCUMENTS

| | | | |
|---|---|---|---|
| 6,018,263 A * | 1/2000 | Tihanyi | 327/374 |
| 6,700,428 B2 | 3/2004 | Sander | |
| 7,129,759 B2 * | 10/2006 | Fukami | 327/110 |
| 7,889,529 B2 * | 2/2011 | Asai | 363/132 |
| 2002/0079944 A1 * | 6/2002 | Sander | 327/309 |
| 2005/0104153 A1 * | 5/2005 | Yasuda | 257/477 |

* cited by examiner

*Primary Examiner* — Jared Fureman
*Assistant Examiner* — Nicholas Ieva
(74) *Attorney, Agent, or Firm* — McGinn IP Law Group, PLLC

(57) ABSTRACT

A semiconductor device includes an output transistor which controls a power supply to a load according to a control voltage applied to a gate thereof, a voltage control circuit coupled between the gate and a drain of the output transistor, the voltage control circuit having a conduction state controlled according to a potential difference between a source and the drain of the output transistor, and a voltage control detection circuit which outputs a voltage control detection signal on a basis of the conduction state of the voltage control circuit. A first discharge switch is connected between the gate and the source of the output transistor, an on-off state of the first discharge switch being controlled according to the voltage control detection signal, a second discharge switch is series-connected to the first discharge switch between the gate and the source of the output transistor, an on-off state of the second discharge switch being controlled according to a temperature condition of the output transistor, and a third discharge switch is connected in parallel with the first and second discharge switches.

20 Claims, 8 Drawing Sheets

US 8,289,669 B2

SEMICONDUCTOR DEVICE INCLUDING OVER VOLTAGE PROTECTION CIRCUIT HAVING GATE DISCHARGE CIRCUIT OPERATED BASED ON TEMPERATURE AND VOLTAGE AS TO OUTPUT TRANSISTOR

This application is based upon and claims the benefit of priority from Japanese Patent Application No. 2008-304161 which was filed on Nov. 28, 2008, the disclosure of which is incorporated herein in its entirety by reference.

BACKGROUND OF THE INVENTION

1. Field of the Invention

The present invention relates to a semiconductor device and, more particularly, to an overvoltage protection circuit.

2. Description of Related Art

Demand for an increase in surge breakdown voltage in a power switch for automotive electrical equipment has been growing in recent years. For example, an inductance load such as a solenoid or an inductance component of a wire harness is connected to an output stage of a power switch for automotive electrical equipment. If an inductance load is connected to an output stage of a power switch, as described above, a back electromotive force is generated when the power switch is turned off. The voltage of a voltage surge corresponding to the back electromotive force may be applied to the output stage of the power switch. In this case, if the voltage exceeds the breakdown voltage (withstand voltage) of a transistor in the output stage of the power switch, then the output transistor breaks down, and a breakdown current flows. The breakdown current degrades the output transistor, which is problematic. For this reason, in a power switch, an output transistor is generally protected from overvoltage using an overvoltage protection circuit.

FIG. 6 shows a circuit diagram of a semiconductor device (overvoltage protection circuit) according to U.S. Pat. No. 6,700,428. A semiconductor device 10 shown in FIG. 6 includes a first terminal K1, a second terminal K2, a load Z, a first transistor T1, a control input terminal K3, a voltage control circuit SB, a gate discharge circuit SC, and a temperature sensor circuit TS.

The first terminal K1 is connected to one terminal of the load Z. The other terminal of the load Z is connected to a first power supply (high-side power supply) V+. The second terminal K2 is connected to a second power supply (low-side power supply) GND. A driving signal S1 is supplied to the semiconductor device 10 through the control input terminal K3. The first transistor T1 is an n channel type power MOSFET and has a drain connected to the first terminal K1 and a source connected to the second terminal K2. With this configuration, the first transistor T1 forms a main current path for supplying current to the load. A gate of the first transistor T1 is connected to the control input terminal K3 for controlling a driving current for the first transistor T1 through a resistor R1. Note that the first transistor T1 has a gate-to-source capacitance Cg (parasitic capacitance) between the gate and the source.

The voltage control circuit SB is connected between the drain and the gate of the first transistor T1. A second control signal S2 is supplied to the voltage control circuit SB. The voltage control circuit SB exhibits a conducting state if there is a risk that the source-to-drain voltage of the first transistor T1 rises to break down the first transistor T1 (e.g., generation of a back electromotive force caused by the inductance or the like of the load). Electric charge is supplied from the drain of the first transistor T1 to the gate, thereby causing the first transistor T1 to exhibit a conducting state. This prevents the source-to-drain voltage Uds of the first transistor T1 from rising further.

The voltage control circuit SB has a first zener diode Z1, a second zener diode Z2, a diode D1, and a second transistor T2. The first zener diode Z1 and second zener diode Z2 are series-connected to each other. The second transistor T2 is a p channel type MOSFET and is connected in parallel with the second zener diode Z2. The second control signal S2 is inputted to a gate of the second transistor T2. The two zener diodes Z1 and Z2 are connected in a reverse direction between the drain and the gate of the first transistor T1. The diode D1 is series-connected to the two zener diodes Z1 and Z2. The diode D1 is also connected in a forward direction between the drain and the gate of the first transistor T1. This prevents a current from flowing from the gate of the first transistor T1 into the drain.

The gate discharge circuit SC has a driving circuit A3 and a third transistor T3. A source of the third transistor T3 is connected to the second power supply GND through the second terminal K2. A drain of the third transistor T3 is connected to the gate of the first transistor T1. An output terminal of the driving circuit A3 is connected to a gate of the third transistor T3. That is, the on-off state of the third transistor T3 is controlled by a third control signal S3 outputted from the driving circuit A3. An output terminal of the temperature sensor circuit TS thermally coupled to the first transistor T1 is connected to an input terminal of the driving circuit A3. That is, a temperature detection signal S4 outputted from the temperature sensor circuit TS based on the temperature state of the first transistor T1 is inputted to the driving circuit A3.

The operation of the circuit shown in FIG. 1 will be described briefly. FIG. 7 illustrates timing charts showing the operation of the circuit in FIG. 6. Note that, as will be described below, a problem may occur if the first transistor T1 is turned off (the first transistor T1 is controlled to switch from an on state to an off state) at high speed during a process in which the operation shown in FIG. 7 shifts from [f] to [g].

A case where the first transistor T1 is turned off ([c] in FIG. 7) will be described first. The first control signal S1 at low level is inputted to the gate of the first transistor T1. This causes electric charge accumulated in the gate-to-source capacitance Cg of the first transistor T1 to be discharged and the first transistor T1 to exhibit a non-conducting state. The second control signal S2 at high level is inputted to the gate of the second transistor T2. This causes the second transistor T2 to exhibit a non-conducting state. If a back electromotive force is generated by an inductance load or a wiring inductance (hereinafter referred to as a load inductance component) during the operation process, then the source-to-drain voltage of the first transistor T1 may rise.

In this case, if the source-to-drain voltage of the first transistor T1 becomes higher than a voltage (clamping voltage) which is set on the basis of the breakdown voltages of the zener diodes Z1 and Z2, then a current flows from the drain of the first transistor T1 to the gate through the zener diodes Z1 and Z2. (Note that it is actually necessary to set the clamping voltage in consideration of a resistance component of the diode D1, a wiring resistance component, a gate-to-source voltage for turning on the first transistor T1, and the like, in addition to the above-described breakdown voltage.) The flow of the current from the drain of the first transistor T1 to the gate causes electric charge to be stored in the gate-to-source capacitance Cg of the first transistor T1. The first transistor T1 thus exhibits a conducting state. For this reason, the source-to-drain voltage of the first transistor T1 can be limited to the clamping voltage.

The operation ([g] in FIG. 7) when the first transistor T1 is turned on ([e] in FIG. 7), and the temperature sensor circuit TS detects a temperature anomaly (hereinafter referred to as a load anomaly) ([f] in FIG. 7) will be described. In this case, the third transistor T3 included in the gate discharge circuit SC is brought into conduction, thereby discharging the electric charge accumulated in the gate-to-source capacitance Cg of the first transistor T1. This brings the first transistor T1 out of conduction. In contrast, the second transistor T2 exhibits a conducting state and shorts the second zener diode Z2. In this case, if a back electromotive force caused by a load inductance component is generated during a process in which the electric charge accumulated in the gate-to-source capacitance Cg of the first transistor T1 is discharged, and the first transistor T1 exhibits a non-conducting state, then the source-to-drain voltage of the first transistor T1 may rise.

When the source-to-drain voltage of the first transistor T1 becomes higher than the voltage (clamping voltage) set on the basis of the breakdown voltage of the first zener diode Z1 in this state ([e] in FIG. 7), a current flows from the drain of the first transistor T1 to the gate through the zener diode Z1. (Note that it is actually necessary to set the clamping voltage in consideration of the resistance component of the diode D1, the wiring resistance component, the gate-to-source voltage for turning on the first transistor T1, and the like, in addition to the above-described breakdown voltage.) The flow of the current from the drain of the first transistor T1 to the gate causes electric charge to be stored in the gate-to-source capacitance Cg of the first transistor T1. The first transistor T1 thus exhibits a conducting state. For this reason, the source-to-drain voltage of the first transistor T1 can be limited to the clamping voltage.

However, the third transistor T3 of the gate discharge circuit SC is in a conducting state at this time. Accordingly, a large current flows from the first power supply V+ to the third transistor T3 through the first zener diode Z1. In order to bring the first transistor T1 into conduction in this case, it is necessary to generate a gate voltage enough to bring the first transistor T1 into conduction to compensate for a voltage drop caused by the third transistor T3.

In this case, a voltage corresponding to a voltage drop generated by the product of the internal resistance of the first zener diode Z1 and a current flowing therethrough is added to a voltage for clamping the first transistor T1. This is shown in FIG. 5. FIG. 5 shows the static characteristic of a zener diode (e.g., Z2). The abscissa indicates the inverse voltage of the zener diode while the ordinate logarithmically indicates a zener diode current. At the time of turnoff under a normal load, the zener diode operates as indicated by an operating point Q1. In contrast, since the current flowing through the zener diode increases from Iz1 to Iz2 in voltage control operation at the time of turnoff after a load anomaly is detected, the zener diode operates as indicated by an operating point Q2. This increases the inverse voltage of the zener diode from Vz1 to Vz2.

As described above, in turnoff operation with a load anomaly, a voltage corresponding to a voltage drop generated by the product of the internal resistance of the first zener diode Z1 and a current flowing therethrough is added to the voltage for clamping the first transistor T1. For this reason, even if the source-to-drain voltage of the first transistor T1 rises and reaches a withstand voltage due to a load inductance component, the voltage control circuit SB may not conduct. This may break down the first transistor T1.

A similar problem occurs if the semiconductor device of the prior art shown in FIG. 6 is used in a high-side configuration (the circuit configuration is not shown) in which the first power supply V+ is connected to the first terminal K1, and the second power supply GND is connected to the second terminal K2 through the load Z. FIG. 8 shows timing charts when the high-side configuration is adopted. Note that if the first transistor T1 is brought into conduction when the high-side configuration is adopted, then it is common to apply a voltage obtained by boosting a voltage at the first power supply V+ to its gate (the voltage is generally generated by a boost circuit such as a charge pump).

Consider a case where the third transistor T3 of the gate discharge circuit SC has low impedance in turnoff operation with a load anomaly. The sections [e], [f], and [g] in FIG. 8 indicate a process to when electric charge accumulated in the gate-to-source capacitance Cg of the first transistor T1 is discharged at high speed (the broken lines in [e] in FIG. 8), and the first transistor T1 exhibits a non-conducting state. In this case, even if the source-to-drain voltage of the first transistor T1 rises and reaches the withstand voltage due to a load inductance component, the voltage control circuit SB may not conduct. This may break down the first transistor T1, which is problematic.

Also consider a case where the third transistor T3 of the gate discharge circuit SC has high impedance in turnoff operation with a load anomaly. In this case, the gate voltage of the first transistor T1 is boosted by a boost circuit or the like. Accordingly, the first transistor T1 remains in an overcurrent state until the gate voltage of the first transistor T1 is lowered to near the voltage at the first power supply V+. That is, it takes long time to turn off the first transistor T1. For this reason, the first transistor T1 suffers from the problem of thermal stress corresponding to a delay time.

SUMMARY

A semiconductor device according to an exemplary aspect of the present invention includes an output transistor whose supply of power to a load is controlled according to a control voltage applied to a gate (a first transistor T1 in a first exemplary embodiment of the present invention), a voltage control circuit connected between the gate and a drain of the output transistor whose conduction state is controlled according to a potential difference between a source and the drain of the output transistor (a voltage control circuit SB in the first exemplary embodiment of the present invention), a voltage control detection circuit which outputs a voltage control detection signal on the basis of the conduction state of the voltage control circuit (a voltage control detection circuit SD in the first exemplary embodiment of the present invention), a first discharge switch connected between the gate and the source of the output transistor whose on-off state is controlled according to the voltage control detection signal (a fourth transistor T4 in the first exemplary embodiment of the present invention), a second discharge switch series-connected to the first discharge switch between the gate and the source of the output transistor whose on-off state is controlled according to a temperature condition of the output transistor (a fifth transistor T5 in the first exemplary embodiment of the present invention), and a third discharge switch connected in parallel with the first and second discharge switches (a third transistor T3 in the first exemplary embodiment of the present invention).

With the above-described circuit configuration, it is possible to control a variation in potential difference of an output transistor caused by a load inductance component or the like.

According to the exemplary aspect of the present invention, it is possible to provide a semiconductor device capable of controlling a variation in potential difference of an output transistor caused by a load inductance component or the like.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
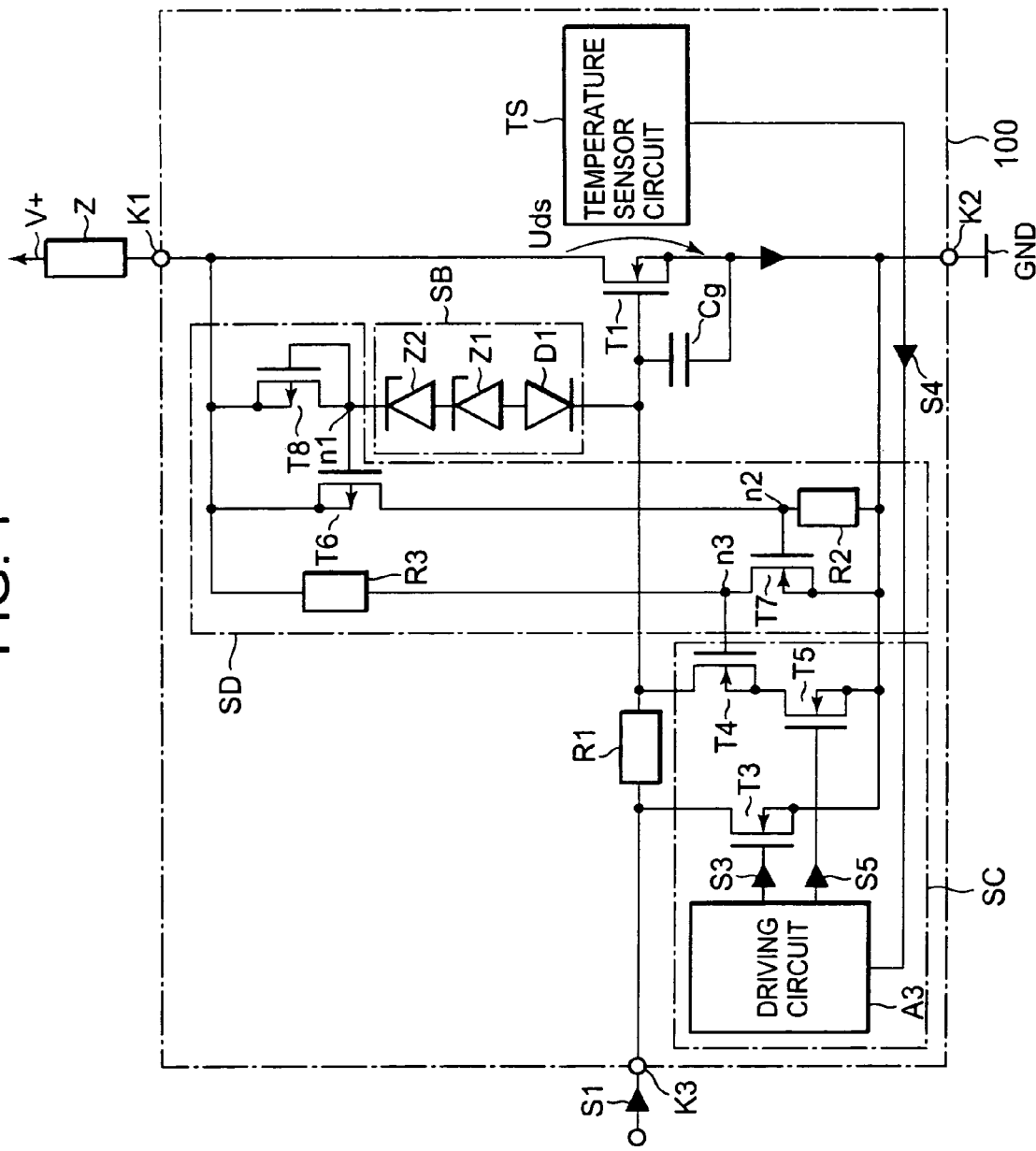
FIG. 1 is a circuit diagram of a semiconductor device according to a first exemplary embodiment of the present invention.

In the following explanation, specific exemplary embodiments to which the present invention is applied will be described in detail below with reference to the drawings. In the drawings, the same components are denoted by the same reference numerals, and duplicate descriptions will be omitted as needed, for clarity of illustration.

First Exemplary Embodiment

FIG. 1 shows a circuit diagram of a semiconductor device according to a first exemplary embodiment. As shown in FIG. 1, a semiconductor device 100 includes a first terminal K1, a second terminal K2, a load Z, a first transistor (an output transistor in Claims for the patent) T1, a control input terminal K3, a voltage control circuit SB, a gate discharge circuit SC, a temperature sensor circuit TS, and a voltage control detection circuit SD.

The first terminal K1 is connected to one terminal of the load Z. The other terminal of the load Z is connected to a first power supply (high-side power supply) V+. The second terminal K2 is connected to a second power supply (low-side power supply) GND. A driving signal S1 is supplied to the semiconductor device 100 through the control input terminal K3. The first transistor T1 is, e.g., an n channel type power MOSFET. A drain of the first transistor T1 is connected to the first terminal K1. A source of the first transistor T1 is connected to the second terminal K2. For this reason, the first transistor T1 forms a main current path for supplying current to the load. A gate of the transistor T1 is connected to the control input terminal K3 for controlling a driving current for the first transistor T1 through a resistor R1. Note that the first transistor T1 has a gate-to-source capacitance Cg (parasitic capacitance) between the gate and the source.

One terminal of the voltage control circuit SB is connected to the gate of the first transistor T1. The other terminal of the voltage control circuit SB is connected to the drain of the first transistor T1 through an eighth transistor (a first transistor in Claims for the patent) T8 provided in the voltage control detection circuit SD. The voltage control detection circuit SD and the voltage control circuit SB each exhibit a conducting state if there is a risk that the source-to-drain voltage of the first transistor T1 rises to break down the first transistor T1 (e.g., generation of a back electromotive force caused by an inductance load or the like). Electric charge is supplied from the drain of the first transistor T1 to the gate, thereby causing the first transistor T1 to exhibit a conducting state. This prevents a source-to-drain voltage Uds of the first transistor T1 from rising further.

The voltage control circuit SB has a first zener diode Z1, a second zener diode Z2, and a diode D1. The first zener diode Z1 and second zener diode Z2 are series-connected to each other. The two zener diodes Z1 and Z2 are connected in a reverse direction between the drain and the gate of the first transistor T1. The diode D1 is series-connected to the zener diodes Z1 and Z2. The diode D1 is also connected in a forward direction between the drain and the gate of the first transistor T1. This prevents a current from flowing from the gate of the first transistor T1 into the drain.

The voltage control detection circuit SD has the eighth transistor T8, a resistive element R2, a resistive element R3, a sixth transistor T6, and a seventh transistor T7. The eighth transistor T8 is, e.g., a p channel type MOSFET. A source of the eighth transistor T8 is connected to the drain of the first transistor T1. A gate and a drain of the eighth transistor T8 are connected to a common connection point n1. That is, the eighth transistor T8 is diode-connected. The connection point n1 is further connected to the other terminal of the voltage control circuit SB and a gate of the sixth transistor T6. Note that if the voltage control circuit SB is in a non-conducting state, the potential at the connection point n1 exhibits a value equal to the value of the drain potential of the first transistor T1. On the other hand, if the voltage control circuit SB is in a conducting state, since a voltage drop caused by the eighth transistor T8 occurs, then the potential at the connection point n1 exhibits a value lower than the value of the drain potential of the first transistor T1.

The potential at the connection point n1 of the voltage control detection circuit SD is converted into a signal based on the level of the voltage across the terminal K1 and the terminal K2 by a first inverter circuit and a second inverter circuit. The signal is supplied to a gate of a fourth transistor T4 included in the gate discharge circuit SC. The first inverter circuit is composed of the sixth transistor T6 (e.g., a p channel type MOSFET) series-connected between the terminal K1 and the terminal K2 and the resistive element R2. A source of the sixth transistor T6 is connected to the first terminal K1. A drain of the sixth transistor T6 is connected to one terminal of the resistive element R2 and a gate of the seventh transistor T7 through a connection point n2. The other terminal of the resistive element R2 is connected to the terminal K2. The second inverter circuit is composed of the seventh transistor T7 (e.g., an n channel type MOSFET) series-connected between the terminal K1 and the terminal K2 and the resistive element R3. A source of the seventh transistor T7 is connected to the terminal K2. A drain of the seventh transistor T7 is connected to one terminal of the resistive element R3 and the gate of the fourth transistor T4 through a connection point n3. The other terminal of the resistive element R3 is connected to the terminal K1.

The gate discharge circuit SC has a third transistor T3 (for example, "third discharge switch"), the fourth transistor (for example, "first discharge switch") T4, and a fifth transistor (for example, "second discharge switch") T5. The third transistor T3 here is, e.g., an n channel type MOSFET. The fourth transistor T4 is, e.g., an n channel type MOSFET. The fifth transistor T5 is, e.g., an n channel type MOSFET. Note that the third transistor T3 has a high impedance characteristic in the example of this exemplary embodiment. In contrast, the fourth transistor T4 and fifth transistor 15 each have a lower impedance characteristic compared to the third transistor T3.

A drain of the third transistor T3 is connected to the gate of the first transistor T1 through the resistive element R1. A source of the third transistor T3 is connected to the terminal K2. A third control signal S3 outputted from a driving circuit A3 is inputted to a gate of the third transistor T3, thereby controlling the on-off state of the third transistor T3. A drain of the fourth transistor T4 is connected to the gate of the first transistor T1. A source of the fourth transistor T4 is connected to a drain of the fifth transistor T5. A source of the fifth transistor T5 is connected to the terminal K2. A fifth control signal S5 outputted from the driving circuit A3 is inputted to a gate of the fifth transistor T5, thereby controlling the on-off state of the fifth transistor T5.

An output terminal of the temperature sensor circuit TS thermally coupled to the first transistor T1 is connected to an input terminal of the driving circuit A3. That is, a temperature detection signal S4 outputted from the temperature sensor circuit TS based on the temperature state of the first transistor T1 is inputted to the driving circuit A3. For example, if the temperature sensor circuit TS detects a temperature anomaly or the like (hereinafter referred to as a "load anomaly") in the first transistor T1, then the control signal S5 at high level is outputted from the driving circuit A3 in accordance with the temperature detection signal S4. On the other hand, if the temperature sensor circuit TS detects no load anomaly, then the control signal 5 at low level is outputted from the driving circuit A3. When the first transistor T1 is to be turned off (the first transistor T1 is to be controlled to switch from an on state to an off state), the control signal S3 always at high level is outputted from the driving circuit A3. On the other hand, when the first transistor T1 is to be turned on (the first transistor T1 is to be controlled to switch from an off state to an on state), the control signal S3 at low level is outputted.

Figure 2:
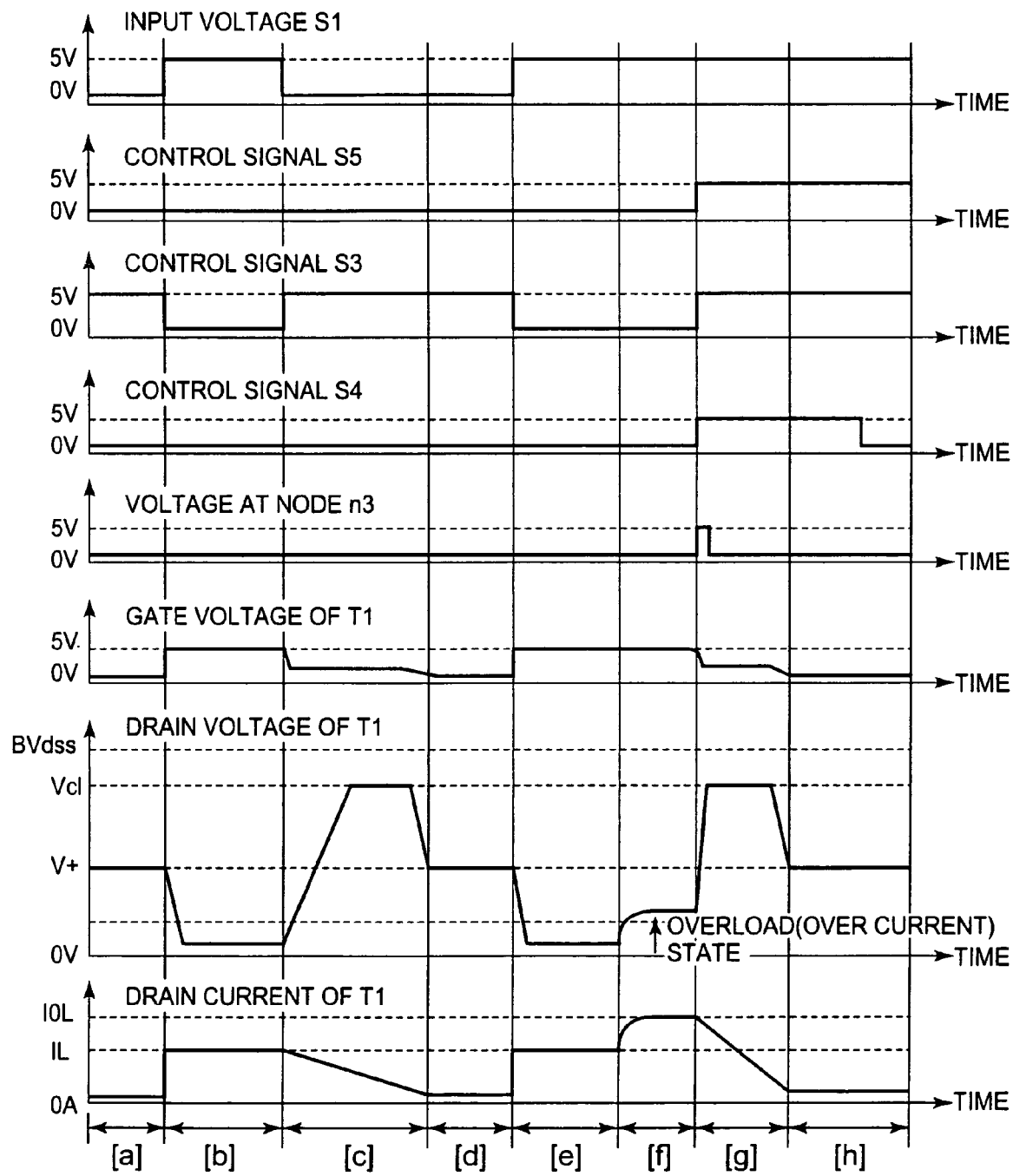
FIG. 2 illustrates a timing chart showing the operation of the semiconductor device according to the first exemplary embodiment of the present invention.

FIG. 2 illustrates timing charts showing the operation of the semiconductor device 100 according to the first exemplary embodiment of the present invention. The operation will be described as separate operations, an operation in which the first transistor T1 is turned on when the load state is normal ([b] in FIG. 2), an operation in which the first transistor T1 is turned off ([c] in FIG. 2), and an operation in which the first transistor T1 is turned off if the temperature sensor circuit TS detects a load anomaly at the time of turnon ([e], [f], and [g] in FIG. 2).

The operation in which the first transistor T1 is turned on when the load state is normal ([b] in FIG. 2) will be described first. The first control signal S1 at high level is inputted to the gate of the first transistor T1. This causes electric charge to be accumulated in the gate-to-source capacitance Cg of the first transistor T1 and the first transistor T1 to exhibit a conducting state. The third control signal S3 at low level is outputted from the driving circuit A3, thereby causing the third transistor T3 to exhibit a non-conducting state. Since the eighth transistor T8 of the voltage control detection circuit SD is in a non-conducting state, the potential at the connection point n1 exhibits a value equal to the value of the drain potential of the first transistor T1. The voltage control circuit SB is in a state (non-conducting state) electrically disconnected from the drain and gate of the first transistor T1.

Since the potential at the connection point n1 is equal to the drain potential of the first transistor T1, the potential of a signal outputted through the first inverter circuit and second inverter circuit is equal to the drain potential of the first transistor T1. Unless a load anomaly occurs at the time of turning on the first transistor T1, the control signal S5 at low level is outputted from the driving circuit A3 in accordance with the temperature detection signal S4. The fifth transistor T5 thus exhibits a non-conducting state. That is, the third transistor T3 and the fifth transistor T5 are both in a state (non-conducting state) electrically disconnected from between the gate and the source of the first transistor T1.

The operation in which the first transistor T1 is turned off when the load state is normal ([c] in FIG. 2) will be described. The first control signal at low level is inputted to the gate of the first transistor T1. The third control signal S3 at high level is outputted from the driving circuit A3, thereby causing the third transistor T3 to exhibit a conducting state. This causes electric charge accumulated in the gate-to-source capacitance Cg of the first transistor T1 to be discharged. The first transistor T1 thus exhibits a non-conducting state.

Consider a case where a back electromotive force is generated by an inductance load or a wiring inductance (hereinafter referred to as a load inductance component) during the operation process, and the source-to-drain voltage of the first transistor T1 rises. Note that a case where the source-to-drain voltage of the first transistor T1 is lower than a voltage (clamping voltage) which is set on the basis of the breakdown voltage of the voltage control circuit SB and the gate-to-drain voltage of the eighth transistor T8 will be referred to as a potential state a. A case where the source-to-drain voltage of the first transistor T1 is higher than the voltage (clamping voltage) which is set on the basis of the breakdown voltage of the voltage control circuit SB and the gate-to-drain voltage of the eighth transistor T8 will be referred to as a potential state b. (Note that it is actually necessary to set the clamping voltage in consideration of a resistance component of the diode D1, a wiring resistance component, a gate-to-source voltage for turning on the first transistor T1, and the like, in addition to the above-described voltages.)

In the case of the potential state a, the eighth transistor T8 exhibits a non-conducting state. The potential at the connection point n1 thus exhibits a value equal to the value of the drain potential of the first transistor T1. On the other hand, in the case of the potential state b, the eighth transistor T8 exhibits a conducting state. The potential at the connection point n1 thus exhibits a value lower than the value of the drain potential of the first transistor T1.

Note that the control signal S5 at low level is outputted from the driving circuit A3 at the time of turnoff when the load state is normal. The fifth transistor T5 thus exhibits a non-conducting state. For this reason, the fourth transistor T4 is in a state (non-conducting state) electrically disconnected from between the gate and the source of the first transistor T1, regardless of the potential at the connection point n3 of the voltage control detection circuit SD. That is, the electric charge accumulated in the gate-to-source capacitance Cg of the first transistor T1 is not discharged by the fourth transistor T4 having a low impedance characteristic.

In the potential state a, the voltage control circuit SB is in a state (non-conducting state) electrically disconnected from the drain and the gate of the first transistor T1. In this case, the third transistor T3 discharges the electric charge accumulated in the gate-to-source capacitance Cg through the resistor R1. If the first transistor T1 exhibits the potential state b during a process in which the first transistor T1 is turned off, then the eighth transistor T8 included in the voltage control detection circuit SD exhibits a conducting state. The voltage control circuit SB exhibits a state (conducting state) electrically connected to between the first drain and the gate. Note that, in the potential state b, control is performed such that a drain-to-source voltage exceeding the withstand voltage of the first transistor T1 is not applied to the first transistor T1. That is, if the source-to-drain voltage of the first transistor T1 becomes higher than the set clamping voltage, then a current flows from the drain of the first transistor T1 to the gate through the voltage control circuit SB and voltage control detection circuit SD. The flow of the current from the drain of the first transistor T1 to the gate causes electric charge to be stored in the gate-to-source capacitance Cg of the first transistor T1. The first transistor T1 thus exhibits a conducting state. For this reason, the drain-to-source voltage of the first transistor T1 can be limited to the clamping voltage.

The third transistor T3 of the gate discharge circuit SC here is in a conducting state. Accordingly, a current flows from the first power supply V+ to the third transistor T3 through the voltage control circuit SB and voltage control detection circuit SD. In order to bring the first transistor T1 into conduction in this case, it is necessary to generate a gate voltage enough to bring the first transistor T1 into conduction to compensate for a voltage drop caused by the third transistor T3.

Figure 5:
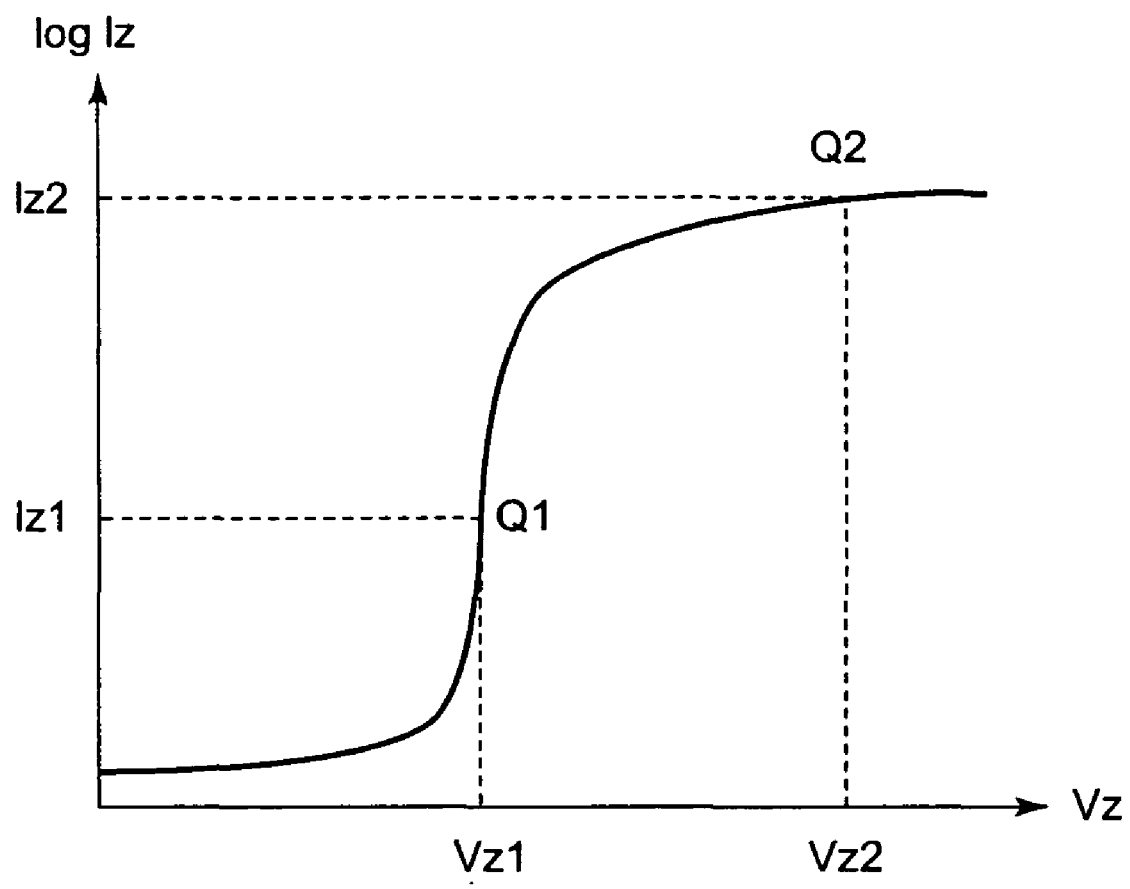
FIG. 5 is a chart showing the static characteristic of a zener diode.
Figure 6:
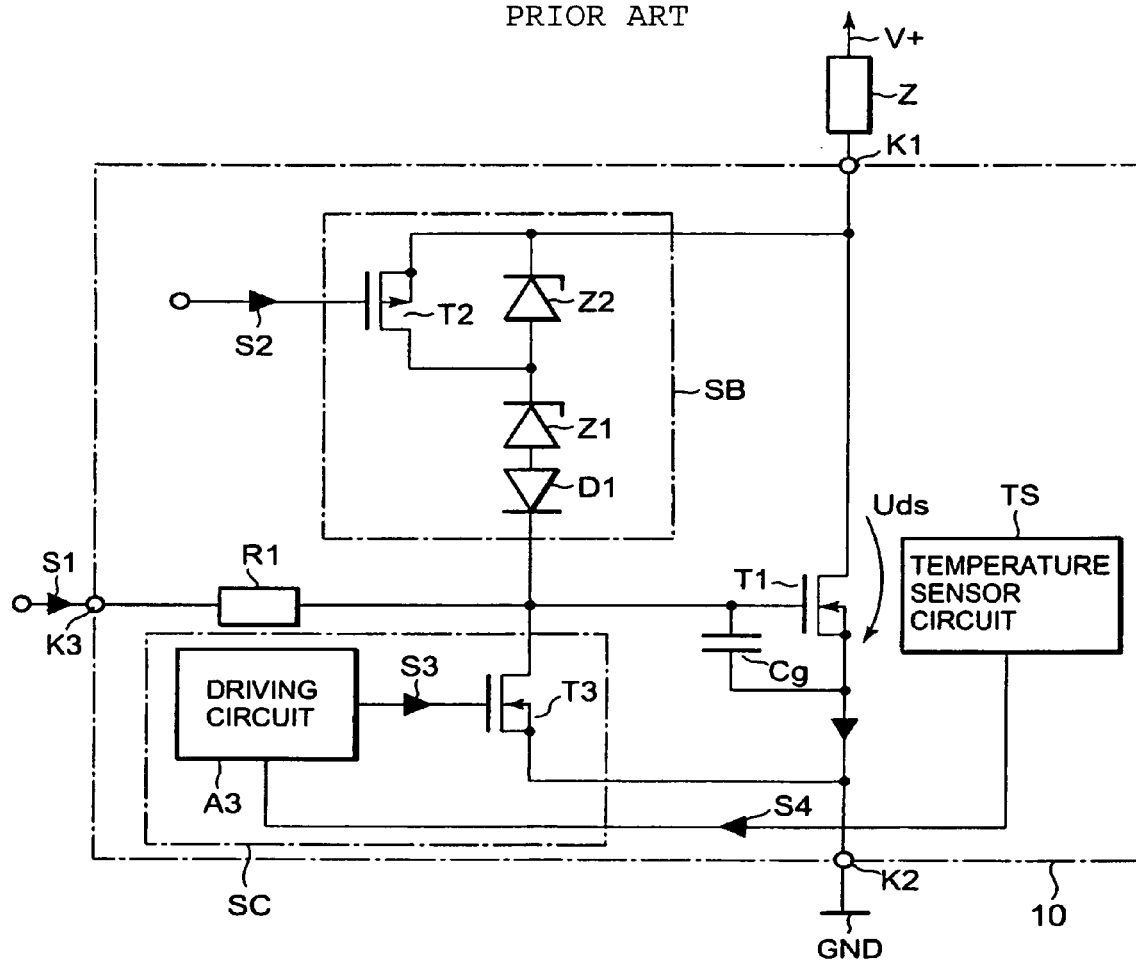
FIG. 6 is a circuit diagram of a semiconductor device of a related art.
Figure 7:
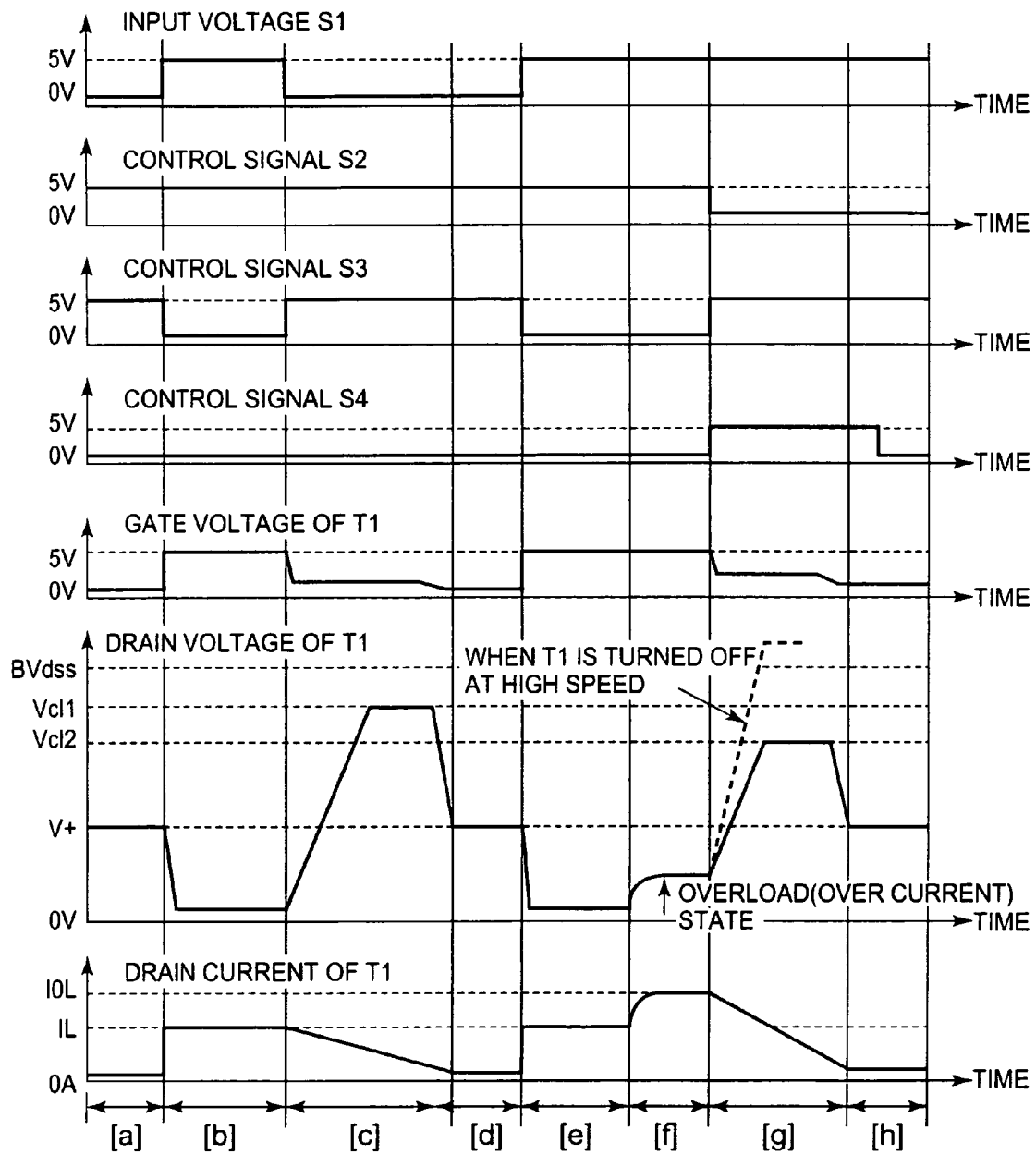
FIG. 7 illustrates timing charts showing the operation of the semiconductor device of the related art.
Figure 8:
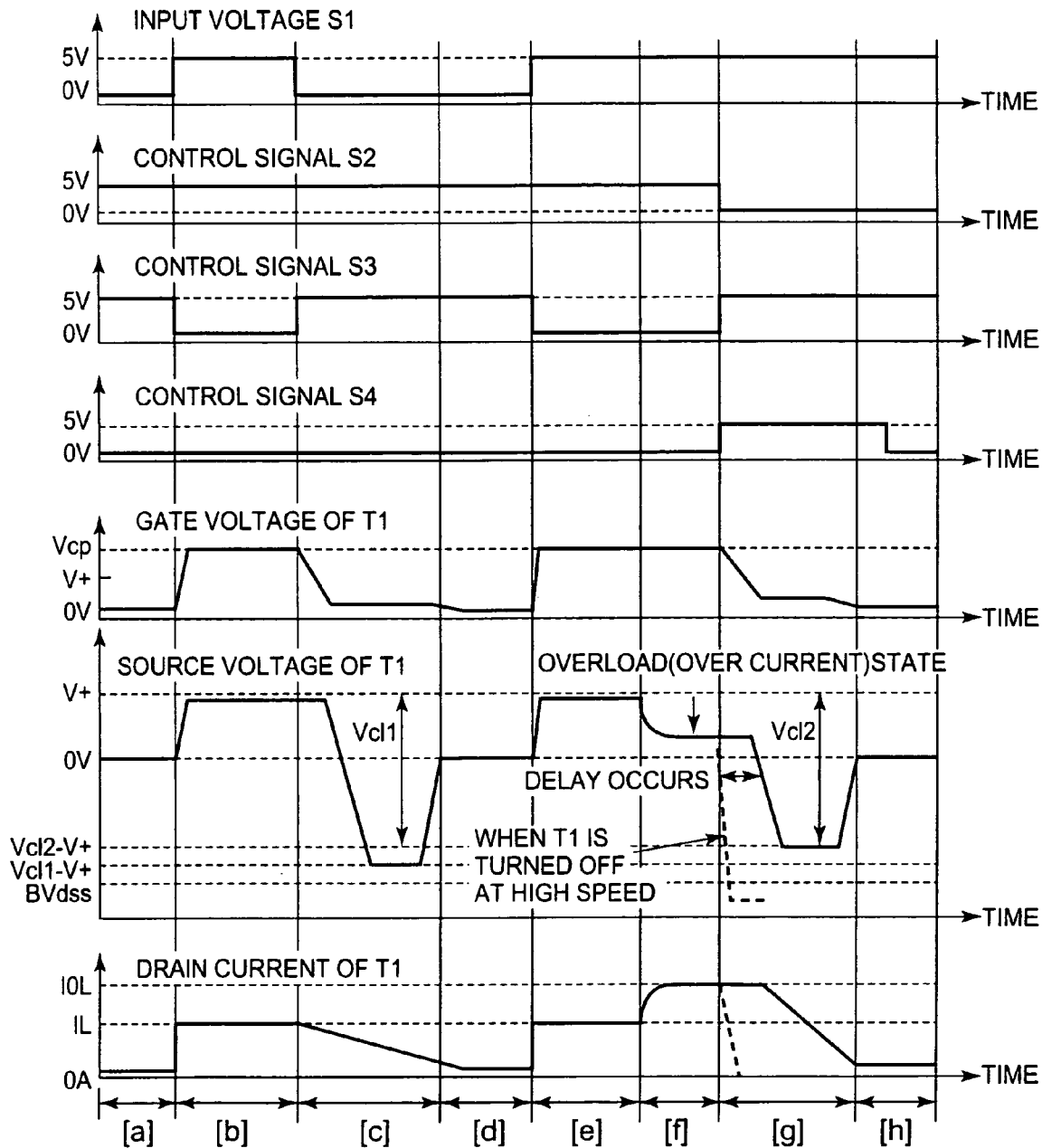
FIG. 8 illustrates timing charts showing the operation of the semiconductor device of the related art.

In this case, a voltage corresponding to a voltage drop generated for the internal resistances of the first zener diode Z1 and the second zener diode Z2 of the voltage control circuit SB is added to a voltage for clamping the first transistor T1, in addition to the sum of the breakdown voltages of the first zener diode Z1 and the second zener diode Z2. However, in the case of the semiconductor device 100 according to the first exemplary embodiment of the present invention shown in FIG. 1, the impedance of the third transistor T3 is high, and a current flowing therethrough thus may be small. Accordingly, a voltage drop caused by the internal resistances of the first zener diode Z1 and the second zener diode Z2 does not substantially occur. That is, as shown in the static characteristic of a zener diode (e.g., Z2) in FIG. 5, each zener diode exhibits operation at a point near an operating point Q1. As described above, in the turnoff operation when the load state is normal, the voltage control circuit SB is capable of suppressing a rise in the source-to-drain voltage of the first transistor T1.

The operation in which the first transistor T1 is turned off if the temperature sensor circuit TS detects a load anomaly at the time of turnon ([e], [f], and [g] in FIG. 2) will be described. First, the first control signal S1 at high level is inputted to the gate of the first transistor T1. The third control signal S3 at low level is outputted from the driving circuit A3, thereby causing the third transistor T3 to exhibit a non-conducting state. If the temperature sensor circuit TS detects a load anomaly in the first transistor T1, then the control signal S3 outputted from the driving circuit A3 shifts from low level to high level. The shift brings the third transistor T3 into conduction. This causes the electric charge accumulated in the gate-to-source capacitance Cg of the first transistor T1 to be discharged. The first transistor T1 thus exhibits a non-conducting state.

During the operation process, in the case of the potential state a, the eighth transistor T8 exhibits a non-conducting state. The potential at the connection point n1 thus exhibits a value equal to the value of the drain potential of the first transistor T1. On the other hand, in the case of the potential state b, the eighth transistor T8 exhibits a conducting state. The potential at the connection point n1 thus exhibits a value lower than the value of the drain potential of the first transistor T1.

If a load anomaly in the first transistor T1 is detected, then the control signal S5 at high level is outputted from the driving circuit A3. The fifth transistor T5 thus exhibits a conducting state. Since the connection point n3 of the voltage control detection circuit SD is at high level in the potential state a, the fourth transistor T4 exhibits a conducting state. Note that the potential at the connection point n3 exhibits a value obtained by subjecting the potential at the connection point n1 to signal conversion in the first and second inverter circuits. That is, in this example, if the potential at the connection point n1 is equal to the drain potential of the first transistor T1, then the potential at the connection point n3 exhibits a value (high level) equal to the value of the drain potential of the first transistor T1. On the other hand, if the potential at the connection point n1 is lower than the drain potential of the first transistor T1, then the potential at the connection point n3 exhibits a value (low level) equal to the value of the source potential of the first transistor T1.

For this reason, the electric charge accumulated in the gate-to-source capacitance Cg of the first transistor T1 can be discharged not only through the third transistor T3 but also through the transistors T3 and T4. Note that, as described above, since the transistors T3 and T4 each have a low impedance characteristic, the electric charge can be discharged at high speed. Note that, with the potential state a in this case, the voltage control circuit SB is in a state (non-conducting state) electrically disconnected from the drain and the gate of the first transistor T1.

If the first transistor T1 exhibits the potential state b in the turnoff process with the load anomaly, then the eighth transistor T8 included in the voltage control detection circuit SD exhibits a conducting state. The voltage control circuit SB exhibits a state (conducting state) electrically connected to between the first drain and the gate. Note that, in the potential state b, control is performed such that a drain-to-source voltage exceeding the withstand voltage of the first transistor T1 is not applied to the first transistor T1. Since the potential at the connection point n1 is lower than the drain potential of the first transistor T1 in this case, the connection point n3 exhibits low level. This causes the fourth transistor T4 to exhibit a non-conducting state. Accordingly, the electric charge accumulated in the gate-to-source capacitance Cg of the first transistor T1 is discharged only through the third transistor T3 with a high impedance characteristic.

In this case, a current flows from the drain of the first transistor T1 to the gate through the voltage control circuit SB and voltage control detection circuit SD, thereby causing electric charge to be stored in the gate-to-source capacitance Cg of the first transistor T1. The first transistor T1 thus exhibits a conducting state. For this reason, the drain-to-source voltage of the first transistor T1 can be limited to the clamping voltage.

The third transistor T3 of the gate discharge circuit SC here is in a conducting state. Accordingly, a current flows from the first power supply V+ to the third transistor T3 through the voltage control circuit SB and voltage control detection circuit SD. In order to bring the first transistor T1 into conduction in this case, it is necessary to generate a gate voltage enough to bring the first transistor T1 into conduction to compensate for a voltage drop caused by the third transistor T3.

In this case, a voltage corresponding to a voltage drop generated for the internal resistances of the first zener diode Z1 and the second zener diode Z2 of the voltage control circuit SB is added to a voltage for clamping the first transistor T1, in addition to the sum of the breakdown voltages of the first zener diode Z1 and the second zener diode Z2. However, in the case of the semiconductor device 100 according to the first exemplary embodiment of the present invention shown in FIG. 1, the impedance of the third transistor T3 is high, and a current flowing therethrough thus may be small. Accordingly, a voltage drop caused by the internal resistances of the first zener diode Z1 and the second zener diode Z2 does not substantially occur. That is, as shown in the static characteristic of a zener diode (e.g., Z2) in FIG. 5, each zener diode exhibits operation at a point near the operating point Q1.

As described above, in the turnoff operation when the load anomaly is detected, the first transistor T1 can be turned off at high speed. Additionally, it is possible to accurately suppress a rise in the source-to-drain voltage of the first transistor T1 caused by a load inductance component.

Second Exemplary Embodiment

Figure 3:
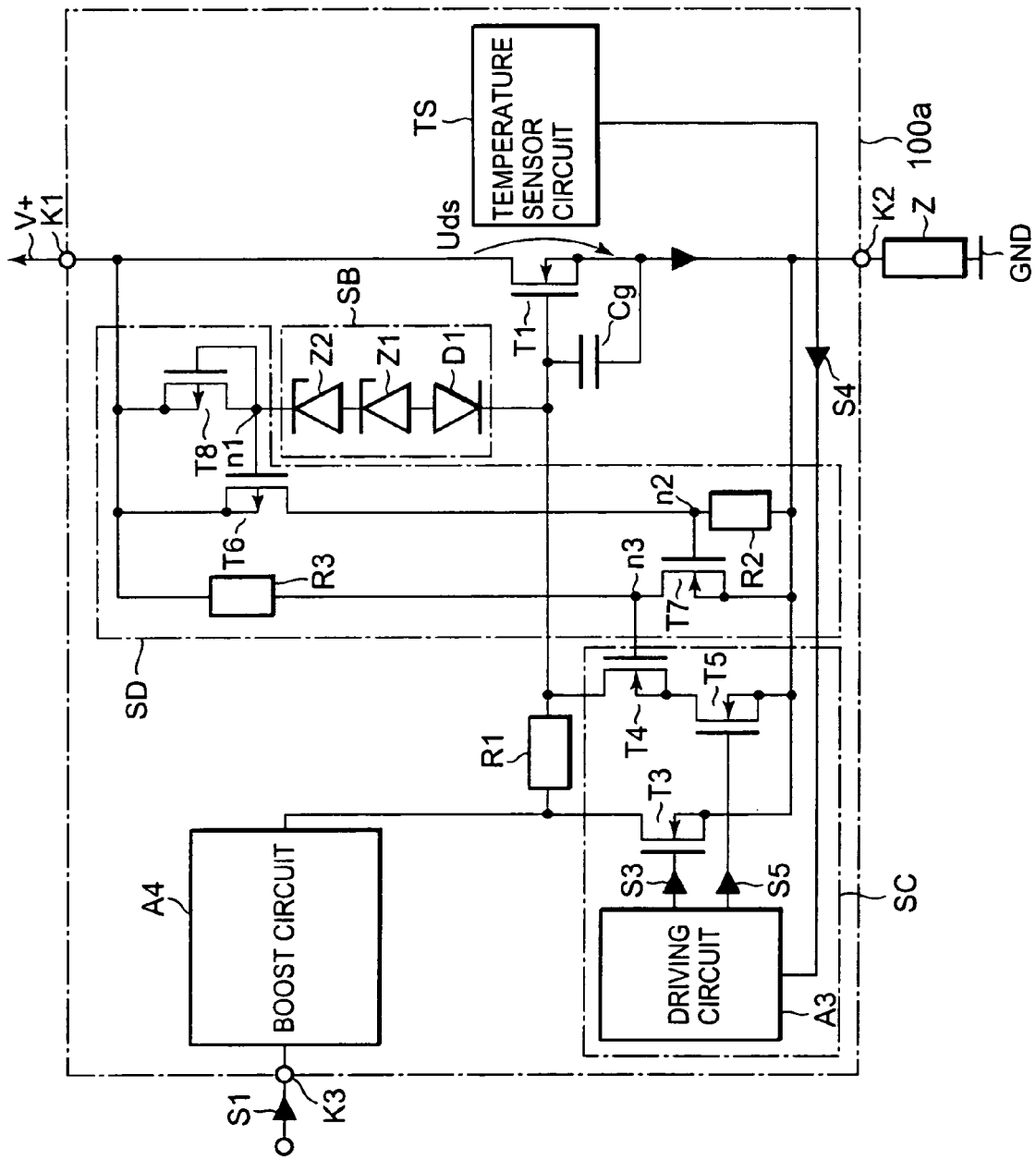
FIG. 3 is a circuit diagram of a semiconductor device according to a second exemplary embodiment of the present invention.

A second exemplary embodiment of the present invention will be described in detail with reference to the drawings. A semiconductor device 100a shown in FIG. 3 is different from the semiconductor device 100 in FIG. 1 described in the first exemplary embodiment of the present invention in a position where a load Z is connected. A first power supply V+ is connected to a first terminal K1 while a second power supply GND is connected to a second terminal K2 through the load Z. That is, the semiconductor device 100a adopts a high-side switch configuration (hereinafter referred to as a "high-side configuration"). The semiconductor device 100a further includes a boost circuit A4, and the on-off state of a first transistor T1 is controlled by a voltage boosted by the boost circuit A4. The other part of the circuit configuration is the same as the first exemplary embodiment, and a description thereof will be omitted.

Figure 4:
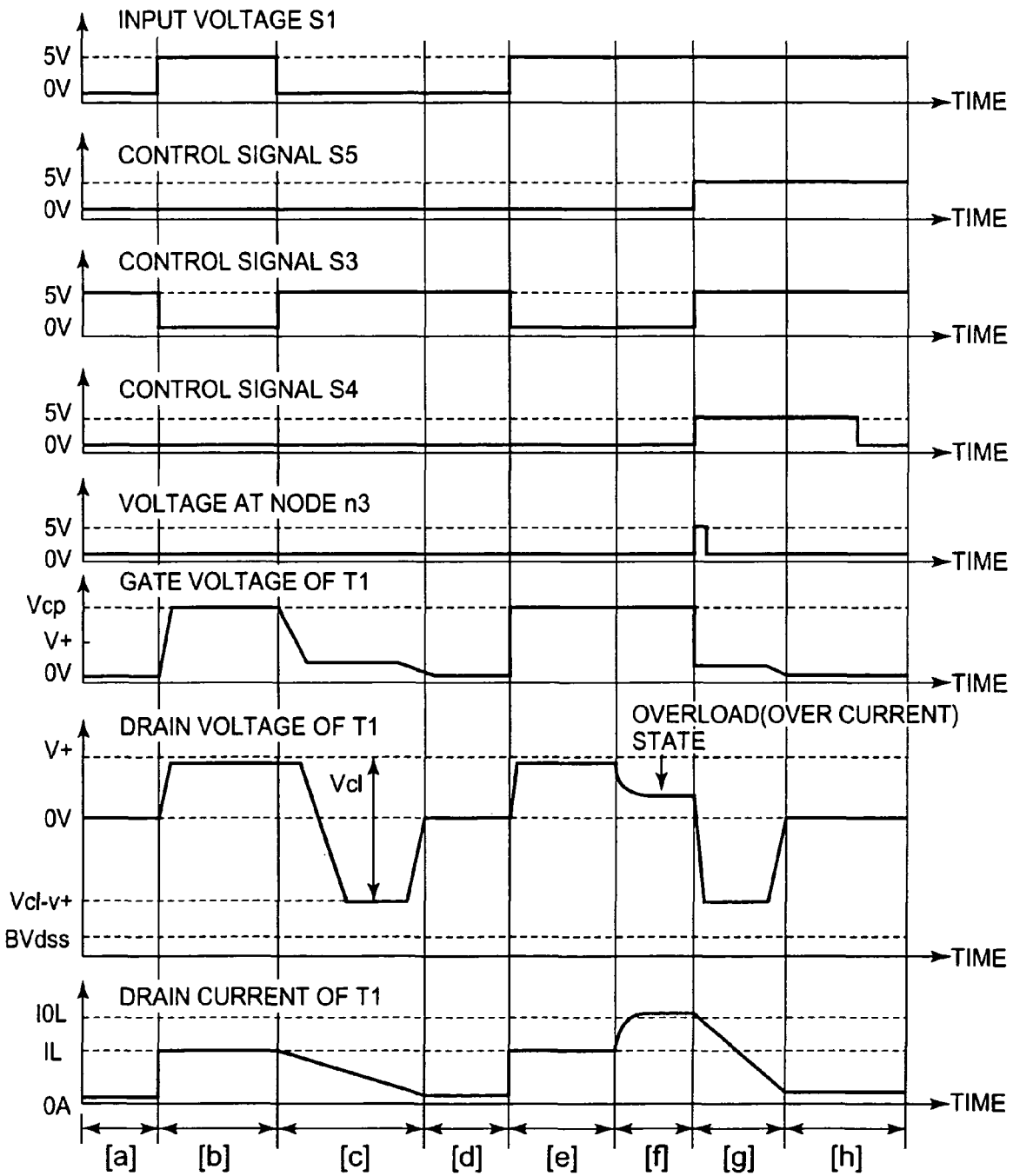
FIG. 4 illustrates a timing chart showing the operation of the semiconductor device according to the second exemplary embodiment of the present invention.

FIG. 4 illustrates timing charts showing the operation of the semiconductor device 100a according to the second exemplary embodiment of the present invention. An operation in which the first transistor T1 is turned on when a load state is normal is shown in [b] in FIG. 4. An operation in which the first transistor T1 is turned off is shown in [c] in FIG. 4. An operation in which the first transistor T1 is turned off when a load anomaly is detected at the time of turnon is shown in [e], [f], and [g] in FIG. 4.

In the case of a circuit with a high-side configuration as shown in FIG. 3, a back electromotive force which is generated in a source of the first transistor T1 due to a load inductance component at the time of turnoff exhibits a voltage lower than the voltage at the second power supply GND. If the drain-to-source voltage of the first transistor T1 exceeds a clamping voltage set by a voltage control circuit SB and a voltage control detection circuit SD, then the drain-to-source voltage of the first transistor T1 is limited to the clamping voltage.

If the first transistor T1 is to be turned off when the load state is normal, then the gate voltage of the first transistor T1 is boosted to a potential higher than the potential at the first power supply V+ by the boost circuit A4 in the early stage of the operation ([c] in FIG. 4). For this reason, it takes long time to discharge electric charge accumulated in a gate-to-source capacitance Cg of the first transistor T1 and reduce the gate voltage to near the voltage at the first power supply V+. That is, it is impossible to turn off the first transistor T1 during a delay period. However, the operation delay is a phenomenon which occurs when the load state is normal. Accordingly, the first transistor T1 suffers from extremely low thermal stress.

If the first transistor T1 is to be turned off when a load anomaly is detected at the time of turnon, then transistors T4 and T5 are in a conducting state in the early stage of the operation. Electric charge accumulated in the gate-to-source capacitance Cg of the first transistor T1 is thus discharged at high speed. For this reason, even if the gate voltage of the first transistor T1 is boosted to a potential higher than the potential at the first power supply V+, the time it takes to reduce the gate voltage to near the voltage at the first power supply voltage V+ is extremely short. That is, a delay time which is generated in the turnoff operation when the load state is normal is not generated. Although thermal stress from which the first transistor T1 suffers in the event of a load anomaly is generally extremely high, since a delay time at the time of turnoff is short, the thermal stress from which the first transistor T1 suffer can be reduced. It is thus possible to prevent the first transistor T1 from being thermally broken down. The other part of the operation is the same as the first exemplary embodiment, and a description thereof will be omitted.

As described above, in the turnoff operation when the load state is normal, a rise in the source-to-drain voltage of the first transistor T1 is suppressed by the voltage control circuit SB, and the first transistor T1 can be turned off at low speed. In the turnoff operation when a load anomaly is detected, the first transistor T1 can be turned off at high speed. Additionally, it is possible to accurately suppress a rise in the source-to-drain voltage of the first transistor T1 caused by a load inductance component.

Note that the present invention is not limited to the above-described exemplary embodiments, and changes may be made without departing from the spirit and scope. For example, although a p channel type MOSFET is used as the eighth transistor T8, the present invention is not limited to the forms of the above-described exemplary embodiments. The eighth transistor T8 may be changed from a p channel type MOSFET to an element such as a diode having a resistance component. Although the third transistor T3 is connected to the gate of the first transistor T1 through the resistive element R1 in the exemplary embodiments of the present invention, the present invention is not limited to this. For example, a circuit configuration in which the third transistor T3 is directly connected to the gate of the first transistor T1 without the mediation of the resistive element R1 may be adopted. In this case, it is possible to perform the same operation as described in the first exemplary embodiment and second exemplary embodiment by further increasing the impedance of the third transistor T3.

Further, it is noted that Applicant's intent is to encompass equivalents of all claim elements, even if amended later during prosecution.

What is claimed is:

1. A semiconductor device, comprising:
an output transistor which controls a power supply to a load according to a control voltage applied to a gate thereof;
a voltage control circuit coupled between the gate and a drain of the output transistor, the voltage control circuit having a conduction state controlled according to a potential difference between a source and the drain of the output transistor;
a voltage control detection circuit which outputs a voltage control detection signal on a basis of the conduction state of the voltage control circuit;
a first discharge switch comprising a conductive path that is configured to be connected between the gate and the source of the output transistor, an on-off state of the first discharge switch being controlled according to the voltage control detection signal;

a second discharge switch comprising a conductive path that is configured to be series-connected to the first discharge switch between the gate and the source of the output transistor, an on-off state of the second discharge switch being controlled according to a temperature condition of the output transistor; and a third discharge switch comprising a conductive path that is configured to be connected between the gate and the source of the output transistor.

2. The semiconductor device according to claim 1, wherein the voltage control circuit includes a zener diode and a diode connected to each other in series.

3. The semiconductor device according to claim 1, wherein the voltage control detection circuit comprises a first transistor connected between the voltage control circuit and the drain of the output transistor and outputs the voltage control detection signal according to a voltage at a connection node of the first transistor and the voltage control circuit.

4. The semiconductor device according to claim 3, wherein the first transistor includes a P channel type MOS transistor having a source connected to the drain of the output transistor, and a gate and a drain both connected to the voltage control circuit.

5. The semiconductor device according to claim 3, wherein the voltage control detection circuit comprises an inverter circuit comprising:
    an input terminal which receives a voltage at the connection node; and
    an output terminal which outputs the voltage control detection signal.

6. The semiconductor device according to claim 1, wherein the first, second and to third discharge switches each includes an N channel type MOS transistor.

7. The semiconductor device according to claim 1, wherein a sum of resistance components of the first discharge switch and the second discharge switch is less than a resistance component of the third discharge switch.

8. The semiconductor device according to claim 1, wherein the load is connected between a high-side power supply and the output transistor.

9. The semiconductor device according to claim 1, wherein the load is connected between a low-side power supply and the output transistor.

10. The semiconductor device according to claim 1, wherein the third discharge switch is connected in parallel with the first and second discharge switches.

11. The semiconductor device according to claim 1, wherein the second discharge switch comprises an output that is connected to an input of the first discharge switch.

12. The semiconductor device according to claim 1, wherein the first discharge switch comprises a gate that is connected to the voltage control detection circuit.

13. The semiconductor device according to claim 1, wherein the voltage control detection circuit comprises a plurality of switches including a first transistor comprising a drain that is connected to a gate of the first discharge switch.

14. The semiconductor device according to claim 1, further comprising a gate discharge circuit outputting a control signal to a gate of the third discharge switch.

15. The semiconductor device according to claim 14, wherein the gate discharge circuit outputs a second control signal to a gate of the second discharge switch.

16. The semiconductor device according to claim 1, further comprising a boost circuit, and the on-off state of the output transistor is controlled by a voltage boosted by the boost circuit.

17. The semiconductor device according to claim 1, wherein, when a load anomaly in the output transistor is detected, the second discharge switch and the first discharge switch each enter a conductive state.

18. The semiconductor device according to claim 1, wherein the first discharge switch and the second discharge switch are each configured to discharge an electric charge accumulated in the output transistor.

19. A semiconductor device, comprising:
    an output transistor coupled between a first terminal and a second terminal;
    a first transistor coupled between the first terminal and a first node;
    a plurality of diodes coupled between the first node and a gate of the output transistor;
    a second transistor having a conductive path between the gate of the output transistor and a second node, and controlled by a signal corresponding to a signal on the first node;
    a third transistor having a conductive path between the second node and the second terminal, and controlled by a temperature information corresponding to the output transistor; and
    a fourth transistor coupled between the gate of the output transistor and the second terminal, and controlled by the temperature information.

20. The semiconductor device, as claimed in claim 19, further comprising:
    a fifth transistor coupled between the first terminal and a third node, and including a gate thereof coupled to the first node;
    a first resistor coupled to the third node and the second terminal;
    a second resistor coupled between the first terminal and a fourth node; and
    a sixth transistor coupled between the fourth node and the second terminal, and including a gate thereof coupled to the third node,
    wherein the second transistor includes a gate thereof coupled to the fourth node.

* * * * *